United States Patent [19]

Riechmann

[11] 4,157,487
[45] Jun. 5, 1979

[54] TELEVISION RECEIVER VERTICAL DEFLECTION SYSTEM AND METHOD

[75] Inventor: Werner Riechmann, Sibbesse, Fed. Rep. of Germany

[73] Assignee: Blaupunkt-Werke GmbH, Hildesheim, Fed. Rep. of Germany

[21] Appl. No.: 822,513

[22] Filed: Aug. 8, 1977

[30] Foreign Application Priority Data

Aug. 28, 1976 [DE] Fed. Rep. of Germany ....... 2638896

[51] Int. Cl.² ............................................. H01J 29/70
[52] U.S. Cl. .................................... 315/393; 315/408; 315/411
[58] Field of Search ................ 315/411, 387, 393, 408

[56] References Cited

U.S. PATENT DOCUMENTS

| 3,845,352 | 10/1974 | Newman et al. | 315/393 |
| 4,048,544 | 9/1977 | Haferl | 315/408 |

*Primary Examiner*—Maynard R. Wilbur
*Assistant Examiner*—Richard E. Berger
*Attorney, Agent, or Firm*—Frishauf, Holtz, Goodman, Woodward

[57] ABSTRACT

To permit use of a circuit in which the energy derived during horizontal flyback is used to control vertical deflection, without damage to the vertical deflection system upon vertical flyback, the vertical deflection output stage is dimensioned to have a time constant which is less, preferably about half, of the time constant of the sawtooth wave generator controlling vertical deflection. The vertical deflection output stage forms, in essence, a parallel oscillatory circuit which, to provide the lesser time constant, is damped.

9 Claims, 1 Drawing Figure

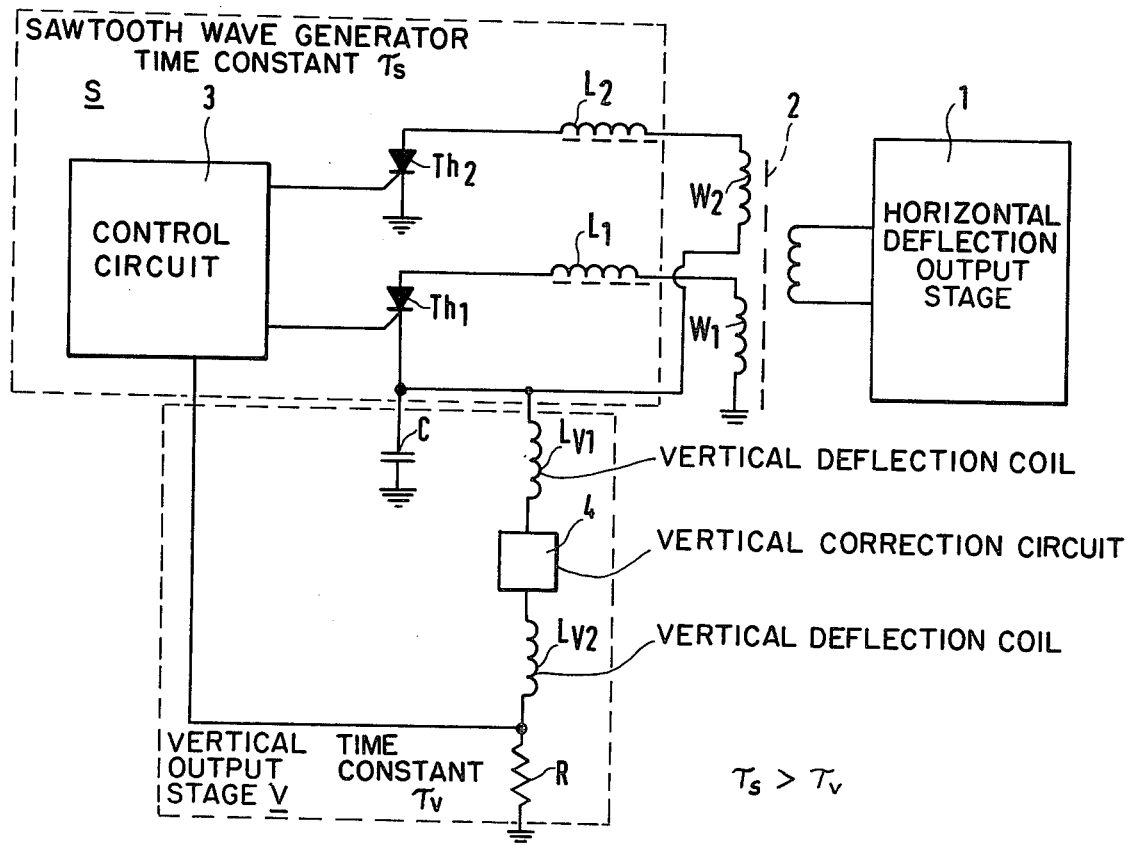

TELEVISION RECEIVER VERTICAL DEFLECTION SYSTEM AND METHOD

The present invention relates to a deflection circuitry for television receivers, and more particularly to a deflection circuit in which energy contained in the horizontal flyback is used in the vertical deflection system.

Video scanning in television receivers is effected, as well known, by a vertical deflection circuit. A pulse generator is synchronized by pulses included in the video signal. The pulses are then applied over a pulse generator, a driver and an output stage to deflection systems, usually deflection coils.

Various types of solid-state circuits have been proposed; for example, U.S. Pat. No. 4,048,544 describes a transistorized vertical deflection circuit with additional circuitry to stabilize the pulses. The time constant of the pulse generator and of the driver stage of such circuits is less than the time constant of the output or final power stage of the vertical deflection circuit. Such vertical deflection circuits have some disadvantages, particularly in that the transistors are operated at high voltages which may result in flash-over and thus damage or destruction of the transistor. The power required to control the final output transistors is already substantial and thus the overall operating efficiency of such a vertical deflection circuit is low.

In earlier developments, a vertical deflection circuitry was proposed which avoids some of the disadvantages of this transistorized circuit; in this earlier circuit, a portion of the energy contained in the horizontal flyback is coupled out and is directly utilized in order to supply current for the vertical deflection coils. To control application of current, a controlled sawtooth wave generator is connected to the final output stage of the vertical deflection circuit, the sawtooth wave generator having a short retrace or flyback time. These vertical deflection circuits also have some disadvantages. The energy derived for vertical deflection is obtained from the horizontal flyback; thus, changes in loading in the vertical deflection circuitry affect the horizontal output stage. The vertical deflection circuit is subject to substantial changes in loading during the vertical flyback or retrace since, in accordance with the previously known circuit, the vertical deflection circuit is not controlled during the vertical flyback or retrace. The lack of control of the vertical deflection circuit causes abrupt changes in loading which result in undesired spurious oscillations in the vertical output stage. These oscillations can so feed back or react on the horizontal output stage that the horizontal flyback pulses are overloaded, the vertical stage starts to oscillate, and high voltages may occur therein during the vertical flyback. This, necessarily, degrades the image quality of the reproduced video picture. High-voltage flash-over may occur and electronic components, particularly solid-state semiconductor elements can be destroyed thereby.

It is an object of the present invention to provide a vertical deflection circuit for television receivers, which has the advantages of utilizing a portion of the energy contained in the horizontal deflection circuit during horizontal flyback without causing abrupt changes in loading on the horizontal output stage and preventing undesired spurious and uncontrolled oscillation of the vertical output stage.

SUBJECT MATTER OF THE PRESENT INVENTION

Briefly, the sawtooth wave generator which controls charging of a charge capacitor of the vertical output stage is controlled to in turn control the charge on the capacitor also during vertical retrace; in accordance with a feature of the invention, this control is obtained by so arranging and relatively matching the time constants of the sawtooth wave generator and of the parallel oscillatory circuit formed by the vertical deflection coils of the T.V. receiver and the charge capacitor that the time constant of the vertical deflection output stage is less, preferably about half that of the time constant of the sawtooth wave generator. This matching can be obtained by so selecting the values of the components of the vertical deflection output stage that the resulting oscillatory circuit formed by the capacitor, resistance elements in the circuit, and the vertical deflection output stage form a damped oscillatory circuit.

The invention will be described by way of example with reference to the accompanying drawings, wherein the single FIGURE is a schematic diagram of a vertical deflection output stage in which the method of the present invention is carried out, and utilizing the system thereof.

A horizontal deflection output stage 1 is connected to a horizontal output transformer 2 which has coupling windings $W_1$ and $W_2$ to derive a portion of the energy contained in the line retrace. This energy is stored in the inductances $L_1$ and $L_2$ and then applied through thyristors $Th_1$ and $Th_2$ to a charge capacitor C. A control circuit 3 is provided triggering the thyristors $Th_1$ and $Th_2$ in such a manner that the charge capacitor C is positively charged during the first half of the video scan and negatively during the second half of the video scan. The charge capacitor C is discharged through the vertical deflection coils $L_{V1}$ and $L_{V2}$, a vertical correction circuit 4 for vertical correction and a feedback resistor R. The voltage drop across feedback resistor R is fed back to the control circuit 3 in order to ensure exact triggering of the thyristors $Th_1$ and $Th_2$ and to control the desired deflection current.

Positive deflection current is obtained during the first half of the video scan by the triggered thyristor $Th_1$; negative deflection current is derived during the second half of the video scan by the triggered thyristor $Th_2$. The thyristors $Th_1$ and $Th_2$ can be triggered during a portion of the video scan simultaneously to result in a linear deflection and provide overlapping, opposite deflection currents.

The control circuit 3, together with the thyristors $Th_1$ and $Th_2$, and the inductances $L_1$ and $L_2$, forms a sawtooth wave generator S. The vertical deflection output stage V is formed of the vertical deflection coils $L_{V1}$, $L_{V2}$, the vertical correction circuit 4, the charge capacitor C and the feedback resistor R. As can be seen from the FIGURE, the capacitor C on the one hand, and the deflection coils, the correction circuit 4 and the resistor R on the other hand form a parallel oscillatory circuit.

The circuit, as far as the diagram is concerned, is known. Uncontrolled, undesired and spurious oscillations in the horizontal output stage can be avoided, in accordance with the invention, by reverse re-charging the capacitor C also during the vertical retrace interval. This re-charging of the capacitor C preferably is carried out continuously and desirably linearly. The controlled re-charging of the capacitor C can be readily obtained by arranging the relative values of the components in the sawtooth wave generator S and in the vertical output stage V such that the time constant $\tau_S$ of the sawtooth wave generator is longer than the time constant $\tau_V$ of the vertical deflection output stage. Mathematically:

$$\tau_S > \tau_V \quad (1)$$

Preferably, the quotient of the time constants should be between 1.5 and 2.5, most desirably about 2, mathematically:

$$1.5 > \tau_S/\tau_V < 2.5 \quad (2)$$

If the time constants of the respective circuits are properly arranged, the thyristors $Th_1$ and $Th_2$ can be precisely triggered also during the short time interval of the vertical flyback or retrace. Due to the short time constant, the vertical deflection circuit can then follow the control from the control circuit 3 exactly; the voltage dropped across the feedback resistor R will permit precise triggering, with respect to time, of the thyristors $Th_1$ and $Th_2$ also during the vertical flyback. In the first half of the video scan, the thyristor $Th_2$ is triggered; in the second half, thyristor $Th_1$ is triggered. This ensures linear flyback.

The time constant $\tau_V$ is essentially determined by the vertical deflection coils $L_{V1}$, $L_{V2}$, the correction circuit 4, and the feedback resistor R which, together with the capacitor C, form a parallel oscillatory circuit. A short time constant corresponds to high damping of this parallel oscillatory circuit. Thus, in accordance with a feature of the present invention, by suitably arranging the ratio of the time constants, the parallel oscillatory circuit will not start undesired uncontrolled oscillations which could interfere with image reproduction quality, or proper operation of the components of the T.V. receiver. The ratio of the time constants can be selected by suitable adjustment of the damping of the oscillatory circuit.

The vertical deflection circuit has an essentially continuous, uniform and even power requirement. This avoids abrupt changes in loading during the vertical retrace. Excessive over-compensation of horizontal flyback pulses, and resulting high voltages which may lead to undesired distortion of the reproduced image and possibly to damage or destruction of components of the video system are avoided. The vertical deflection circuitry, as described, can be readily manufactured and has high operating reliability. The efficiency is high and the power requirement is low.

Various changes and modifications may be made within the scope of the inventive concept.

In a typical T.V. receiver using vertical deflection coils of 20 millihenry inductance, a suitable time constant $\tau_V$ is 0.5 ms. In such a circuit, the resistor R can have a value 1 Ω capacitor C a value of 1.5 μF. and the reflected impedance of correction circuit 4 a value of 1 Ω.

The sawtooth wave generator has a time constant of 1 ms, providing for a slow rise time for 20 milliseconds. The circuit 3 is well known and described in U.S. Pat. No. 4,048,544.

I claim:

1. In a television receiver, having means (1, 2) coupling out a portion of the energy delivered by the horizontal deflection circuit during line flyback or retrace;

a vertical deflection output stage (V) including deflection means ($L_{V1}$, $L_{V2}$) and a charge capacitor element (C);

and a sawtooth wave generator (S), which controls application of the coupled-out energy derived from the horizontal deflection circuit to the vertical deflection means ($L_{V1}$, $L_{V2}$), a method to control vertical deflection comprising, in accordance with the invention, the step of additionally controlling application of the energy to the vertical deflection means by the sawtooth wave generator during the vertical flyback or retrace interval by reversely re-charging said capacitor element during said interval.

2. Method according to claim 1, wherein the re-charging step is carried out continuously.

3. Method according to claim 1, wherein the re-charging step is carried out linearly.

4. Method according to claim 1, wherein the vertical deflection output stage includes, vertical deflection coil elements ($L_{V1}$, $L_{V2}$) and forming with said charge capacitor element (C) said deflection means, a feedback resistor element (R) and a vertical correction circuit element (4), said charge capacitor element and said other elements being connected to form a parallel oscillatory circuit;

said method including the step of controlling the damping of the parallel oscillatory circuit by controlling the relative parameters of said elements.

5. In a television receiver, a vertical deflection system including means (1, 2) coupling out a portion of the energy delivered by the horizontal deflection circuit during line flyback or retrace;

a vertical deflection output stage (V) including vertical deflection means ($L_{V1}$, $L_{V2}$);

and a sawtooth wave generator (S) controlling application of the coupled-out energy to the vertical deflection means during the flyback interval and wherein, in accordance with the invention, the time constant ($\tau_S$) of the sawtooth wave generator (S) is longer than the time constant ($\tau_V$) of the vertical deflection output stage (V).

6. Vertical deflection system according to claim 5, wherein the time constant of the vertical deflection output stage is about twice as long as that of the sawtooth wave generator (S).

7. Vertical deflection system according to claim 5, wherein the ratio of time constants ($\tau_S/\tau_V$) is between about 1.5 to 2.5.

8. Vertical deflection system according to claim 5, wherein the vertical deflection output stage (V) includes a charge capacitor element (C), vertical deflection coil elements ($L_{V1}$, $L_{V2}$) forming said vertical deflection means, a feedback resistor element (R) and a vertical correction circuit element (4), said elements being connected to form a parallel oscillatory circuit;

and wherein said oscillatory circuit is a damped oscillatory circuit.

9. Vertical deflection system according to claim 8, wherein the elements of said oscillatory circuit are dimensioned to provide a time constant which is about half of the time constant of the sawtooth wave generator (S) and is in the order of about 0.5 ms.

* * * * *